United States Patent
Jeong et al.

(10) Patent No.: US 7,002,410 B2
(45) Date of Patent: Feb. 21, 2006

(54) ADAPTIVE LINEARIZATION TECHNIQUE FOR COMMUNICATION BUILDING BLOCK

(75) Inventors: Hei-sam Jeong, Kwangju (KR); Joonbae Park, Seoul (KR); Kyeongho Lee, Seoul (KR)

(73) Assignee: GCT Semiconductor, Inc., San Jose, CA (US)

( * ) Notice: Subject to any disclaimer, the term of this patent is extended or adjusted under 35 U.S.C. 154(b) by 504 days.

(21) Appl. No.: 10/229,267

(22) Filed: Aug. 28, 2002

(65) Prior Publication Data

US 2003/0045264 A1 Mar. 6, 2003

Related U.S. Application Data

(60) Provisional application No. 60/315,367, filed on Aug. 29, 2001.

(51) Int. Cl.
*H03F 1/26* (2006.01)
(52) U.S. Cl. .......................... 330/149; 330/84
(58) Field of Classification Search ............. 330/84, 330/107, 124 R, 149, 151
See application file for complete search history.

(56) References Cited

U.S. PATENT DOCUMENTS

| | | | |
|---|---|---|---|
| 3,970,953 A | 7/1976 | Walker et al. | 330/99 |
| 5,508,657 A | 4/1996 | Behan | 330/151 |
| 5,610,554 A * | 3/1997 | Anvari | 330/52 |
| 6,211,734 B1 * | 4/2001 | Ahn | 330/149 |
| 6,292,055 B1 * | 9/2001 | Chabas | 330/149 |

* cited by examiner

*Primary Examiner*—Steven J. Mottola
(74) *Attorney, Agent, or Firm*—Fleshner & Kim, LLP

(57) ABSTRACT

The present invention is directed to a linearization apparatus and method. Preferred embodiments according to the present invention can combine an auxiliary non-linear block to a functional block of a system to increase linearity of an output signal of the system such as a communication system. System overhead due to the non-linear auxiliary block can be small because of circuit structure, cost and low consumption. Further, the non-linear auxiliary block can be designed so that no feedback path is required. Further preferred embodiments can use a feedback path without loss of stability by using a cancellation apparatus or process based on an averaging detection of the output signal. For example, a feedback loop can detect power leakage in a sideband caused by non-linearities of the communication system.

37 Claims, 10 Drawing Sheets

ADAPTIVE LINEARIZATION TECHNIQUE FOR COMMUNICATION BUILDING BLOCK

This appln. claims the benefit of 60/315,367 filed on Aug. 29, 2001.

BACKGROUND OF THE INVENTION

Background of the Related Art

FIG. 1 shows the basic operational concept of a signal processing block 10 in a communications system. The signal processing block 10 converts an incoming signal to produce a desired output signal via signal amplification, filtering, or frequency translation. Thus, in actual implementation, the signal processing block 10 can include any one of a mixer 12, amplifier 16, filter 14, etc., or even a combination of two or more such functional building blocks. The basic requirement for the functional building blocks is to provide a high level of signal integrity, or no additional impairment to the desired signal. The most common impairment to the desired output signal is non-linearity caused by device non-linearities.

When the non-linearity is taken into account, a formula written as Equation (1) can show the effect of this non-ideal situation, $$Y(t) = a1*x(t) + a2*x^2(t) + a3*x^3(t) \qquad \text{Eq. (1)}$$

where x(t) is an input signal and Y(t) is a resulting output signal. The above equation is also shown graphically in FIG. 2.

As can be shown in FIG. 2, a harmonically related signal such as the third order harmonic signal 22 grows faster than an original signal 21. This fact causes intermodulation and desensitization problems in communications receivers, and causes spectral regrowth in adjacent channel bands at the transmitter. It should be noted that the non-linearity is greater at the third harmonic, and thus the third harmonic signal 22 is illustrated although the problem can involve other harmonics and/or the third harmonic. Such problems become more severe when the input and output power is very large, especially in the case of a power amplifier. Linearization of power amplifiers are important since most power in wireless systems is consumed by the power amplifier.

Current approaches to linearization of signal processing blocks and in particular amplifier linearization have various disadvantages. Current approaches are not general approaches applicable to a variety linearization techniques or non-linear systems. Further, such approaches incur overhead cost including increased size and power requirements. Thus, a need exists for an apparatus and method that is general and can be used in any nonlinear systems, including power amplifier applications, to increase linearity of any communication building block preferably with minimal overhead.

The above references are incorporated by reference herein where appropriate for appropriate teachings of additional or alternative details, features and/or technical background.

SUMMARY OF THE INVENTION

An object of the invention is to solve at least the above problems and/or disadvantages and to provide at least the advantages described hereinafter.

To achieve at least the above objects and advantages in whole or in parts and in accordance with the purpose of the present invention, as embodied and broadly described, a circuit for linearizing an input signal x(t), including a main circuit that receives the input signal with a main transfer function of approximately H1 and outputs a main signal output, a nonlinear auxiliary circuit that receives the input signal and has a nonlinear auxiliary transfer function of approximately H2 and outputs a nonlinear auxiliary signal output, wherein $H_1(X) \sim a_1 X + a_3 X^3$ and $H_2(X) b_1 X + b_3 X^3$ and X is the transform of x(t), $a_1 x a_3 < 0$, $b_1 x b_3 < 0$, $a_1$, and $b_1 - b_3$ is approximately 0, and a combiner coupled to said main circuit and said nonlinear auxiliary circuit that combines said main signal and said auxiliary signal to yield an output signal.

To further achieve at least the above objects and advantages in whole or in parts and in accordance with the purpose of the present invention, as embodied and broadly described, a circuit for linearizing an input signal, including a main circuit that receives the input signal and outputs a main output signal, a nonlinear auxiliary output signal, a combiner coupled to said main circuit and said nonlinear circuit that combines the main signal and the auxiliary signal to yield an output signal, and a feedback loop, wherein said feedback loop receives a portion of the output signal and outputs a non-linearity feedback signal to said auxiliary nonlinear circuit.

To further achieve at least the above objects and advantages in whole or in parts and in accordance with the purpose of the present invention, as embodied and broadly described, a method for linearizing an input signal, including processing the input signal with a main signal processing circuit, processing the input signal with a non-linear circuit, combining an output signal of the main signal processing circuit and the non-linear circuit to generate an output signal, and determining an adjustment to control parameters of the non-linear auxiliary circuit to change one of increase or decrease its non-linearity.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
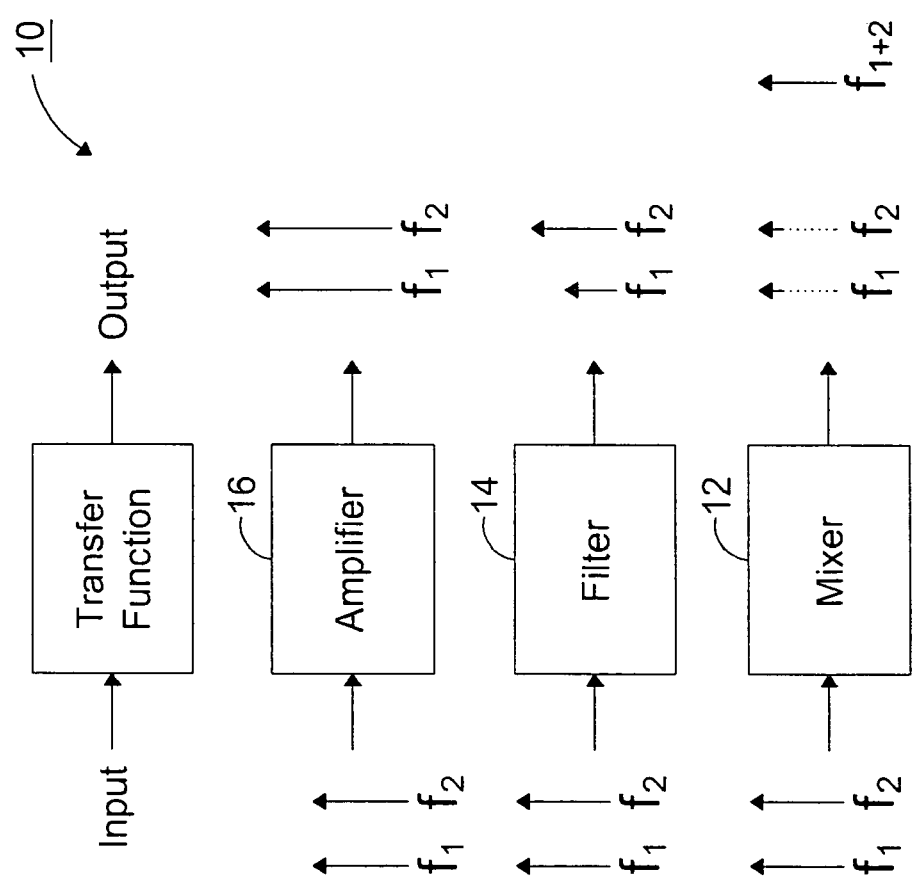
FIG. 1 is a diagram that shows an exemplary related art signal processing blocks.
Figure 2:
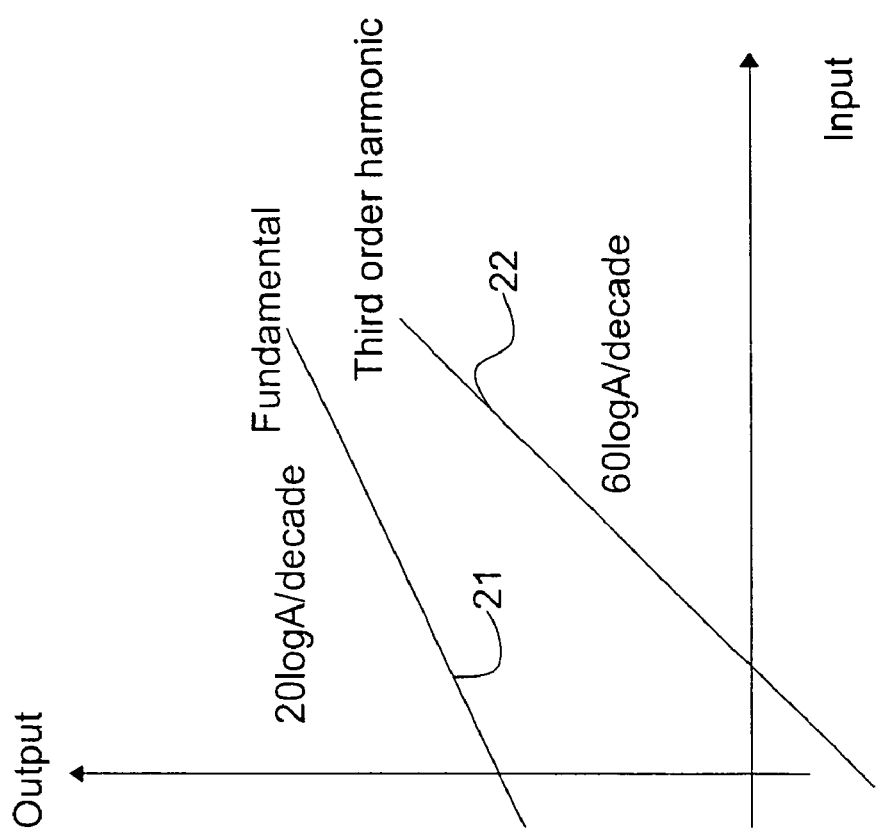
FIG. 2 is a diagram that illustrates exemplary related art signal and corresponding harmonic characteristics.
Figure 3:
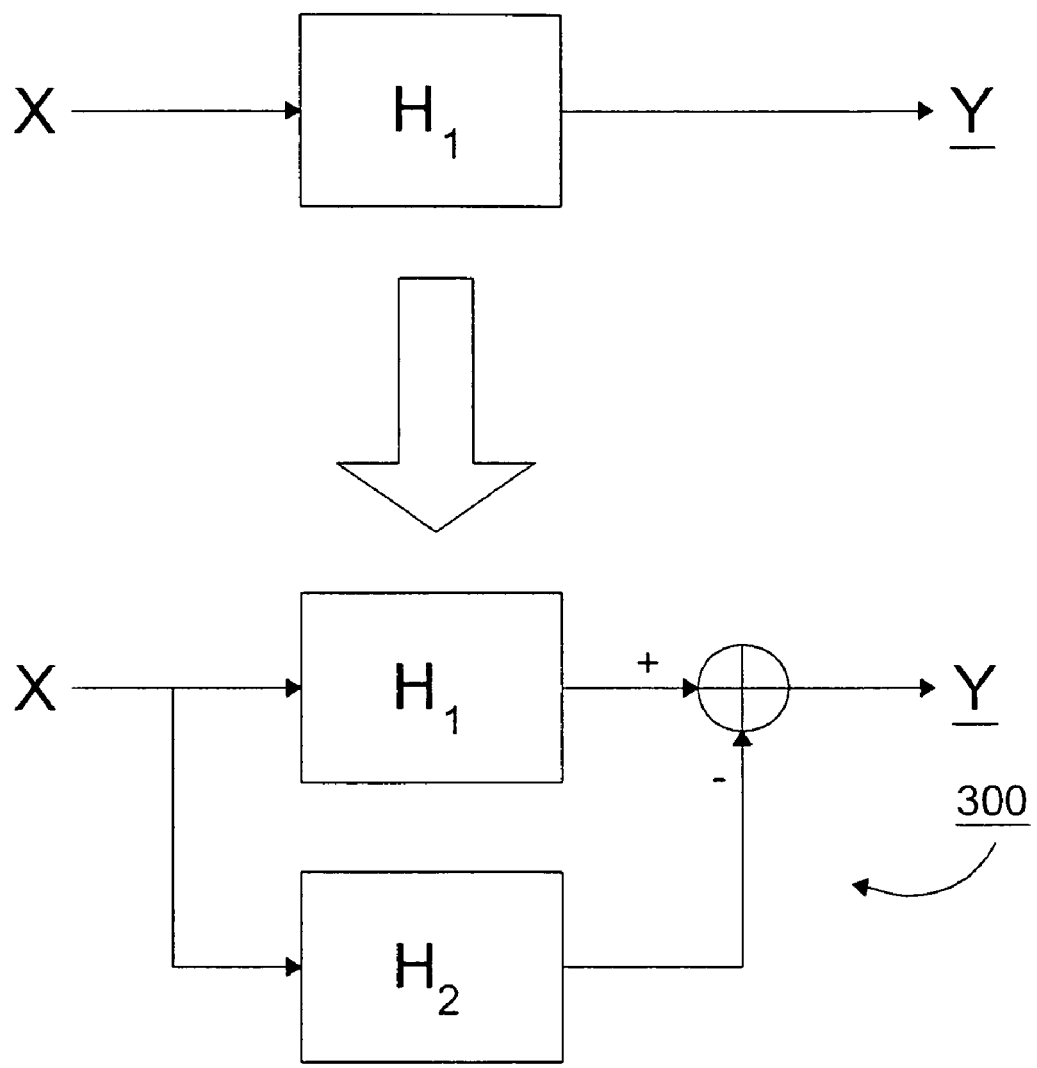
FIG. 3 is a block diagram that illustrates a preferred embodiment of an apparatus for linearization of a signal processing block according to the present invention.

FIG. 3 is a diagram that illustrates a preferred embodiment of a linearization apparatus for a signal processing block according to the present invention. As shown in FIG. 3, the first preferred embodiment of a linearization apparatus for non-linearity cancellation is general and can be used in any non-linear system including power amplifier applications. The first preferred embodiment of a linearization apparatus according to the present invention can increase linearity of a signal processing communication building block or system preferably with reduced or minimal overhead with respect to at least one of size and power consumption requirement.

As shown in FIG. 3, the first preferred embodiment of the linearization apparatus has a signal processing block 300 or system that includes a main signal processing block $H_1$ and an auxiliary compensation building block $H_2$. With respect to the signal processing block 300, X is an input function and Y is a resulting output function. The main signal processing block $H_1$ and the auxiliary compensation building block $H_2$ have transfer functions $H_1(X)$ and $H_2(X)$ that can be written as Equation (2). It should be noted that the non-linearity is most severe at the third harmonic, and thus Equation (2) only contains the fundamental and third order harmonic. However, the disclosed preferred embodiments can be expanded generalized and present invention is not intended to be limited to the third harmonic.

$$H_1(X)=a_1X+a_3X^3, H_2(X)=b_1X+b_3X^3 \quad \text{Eq. (2)}$$

Without loss of generality, the following conditions written as Equation (3) are satisfied in all cases.

$$a_1xa_3<0, b_1xb_3<0 \quad \text{Eq. (3)}$$

If the auxiliary compensation building block $H_2$ is made to be sufficiently non-linear or very non-linear, the following condition written as Equation 4 can be satisfied.

$$a_1-a_3\approx a_1, b_1-b_3\approx 0 \quad \text{Eq. (4)}$$

In that case, the output signal Y(X) of the signal processing block 300 becomes $$Y(X)\approx a_1X.$$

Preferred embodiments of an apparatus and method according to the present invention using the above-described non-linearity cancellation technique are quite effective for the general case, even for low power PA applications, because the auxiliary compensation building block $H_2$ should be designed to have quite a large non-linearity. In practical design, an auxiliary compensation building block $H_2$ can occupy a small area and consumes reduced or little power. Also, since the auxiliary compensation building block $H_2$ can have the same structure as the main signal processing block $H_1$, tracking performance will be increased or very good if the signal processing block 300 has initially well-designed or predetermined parameters that satisfy Equations (2)–(4) or generalized versions thereof. Thus, the main signal processing block $H_1$ can be a preexisting circuit designed with undesired nonlinearities.

Figure 4:
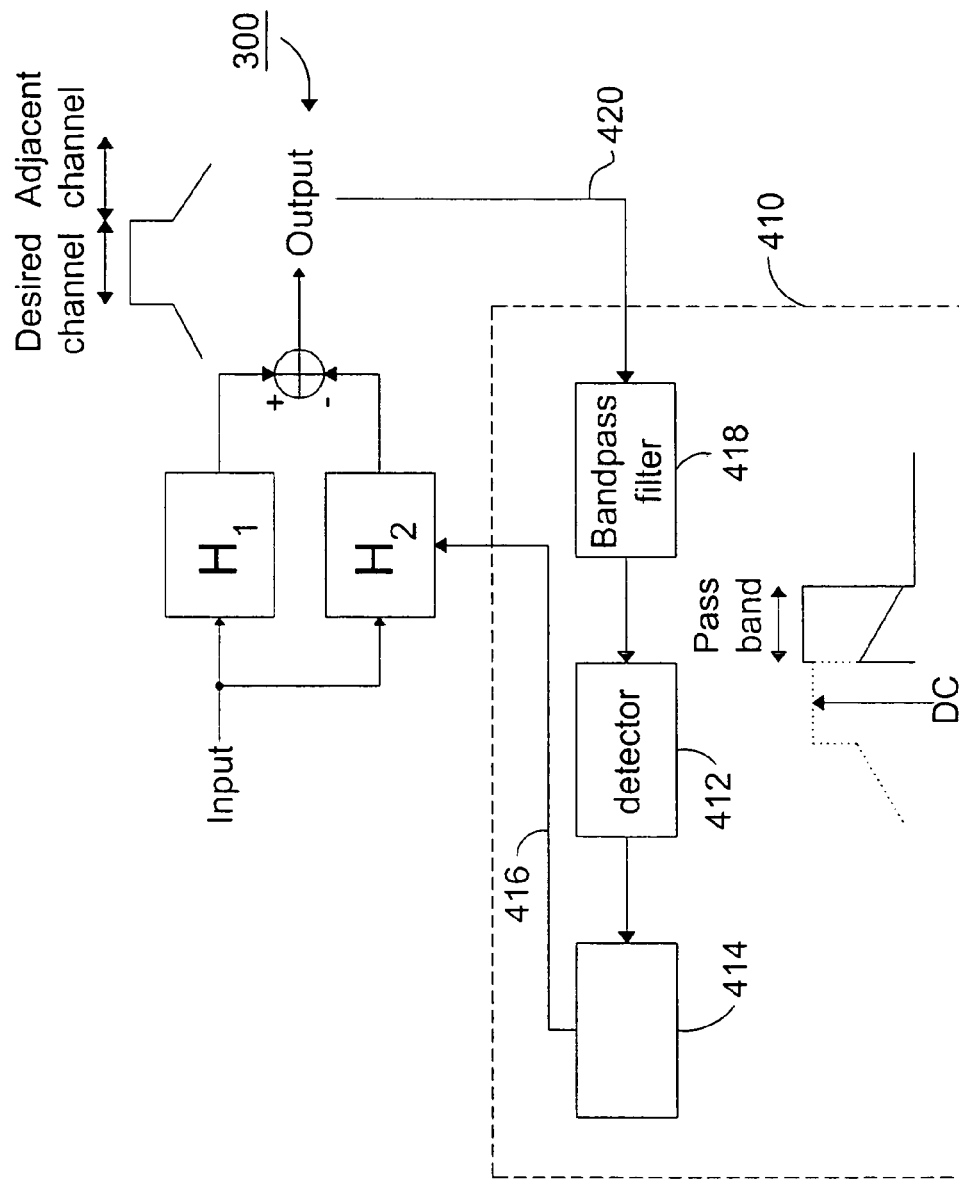
FIG. 4 is a block diagram that illustrates a preferred embodiment of an apparatus for linearization of a signal processing block including a linearization loop according to the present invention.

When an initial estimation of parameters (e.g., linearization and/or system) are difficult, when a determination of parameters are difficult or even when parameters are required for high performance, preferred embodiments of a linearization apparatus or method can include a correction loop or process, respectively, as shown in FIG. 4.

As shown in FIG. 4, the auxiliary compensation building block $H_2$ includes a correction loop 410. When there is too much non-linearity or when cancellation is poor in a signal processing block, spectral leakage caused by intermodulation appears at a nearby channel. The correction loop 410 includes a detector 412 that preferably detects an amount of the spectral component in the nearby channel and provides an output signal corresponding to the detected amount of non-linearity of the block 300. An analyzer 414 receives the output signal from the detector 412 for comparison preferably with predetermined component levels or the like. The analyzer 414 outputs loop control parameters 416 of the auxiliary compensation building block $H_2$. Thus, if the analyzer 414 determines that the spectral leakage component is too large, the loop control parameters 416 of the auxiliary compensation building block $H_2$ are modified to generate a desired change in the non-linearity such as to reduce the non-linearity of the auxiliary block $H_2$. The loop control parameters 416 of the auxiliary compensation building block $H_2$ are parameters affecting the linearity of the block $H_2$. Further, as shown in FIG. 4, the correction loop 410 can modify output signals 420 of the signal processing block 300 before making a determination as to the system performance (e.g., an amount of non-linearity or cancellation). Thus, the correction loop 410 can optionally include a filter 418, for example, that receives the output signal 420 of the block 300 that preferably passes an adjacent or nearby channel of a desired channel of the block 300.

Operations of the preferred embodiment of the linearization apparatus with a correction loop as shown in FIG. 4 will now be described. When there is too much non-linearity or cancellation of the block 300 is poor, spectral leakage caused by intermodulation or the like can appear at the adjacent channel. Using a bandpass filter as the filter 418, a desired amount of intermodulation can preferably be controlled. A power detector as the detector 412 measures this spectral component in the filtered channel received from the bandpass filter 418, and a threshold detector as the analyzer 414 checks whether it is too large. If spectral leakage to the adjacent channel (e.g. sideband) is too large, the correction loop 410 controls the parameters of the auxiliary block $H_2$ to reduce the non-linearity. The loop control parameters 416 can be anything affecting the linearity of the auxiliary block $H_2$. For example, the loop control parameters 416 can be the actual signal level of the auxiliary block or bias level, etc.

The preferred embodiments shown in FIGS. 3–14 can be readily applied to various linearization approaches. A few detailed preferred embodiments according to the present invention are provided below to more clearly explain certain aspects of the invention. However, one skilled in the art will recognize that these embodiments are intended to be exemplary and the invention is not limited merely to these detailed examples.

When the correction loop is applied to high frequency elements such as a power amplifier, the bandpass filter can be quite difficult to implement at the RF frequency itself When operating at 1 GHz with a channel bandwidth of 1 MHz, for example, the bandpass filter should have a quality factor of 1000, which is very difficult or almost impossible to implement. In this case, frequency translation using a mixer or the like can be implemented. Further improvement of performance can be achieved using additional gain stage(s) at the input of the power detector. If the spectral leakage to sideband is small, a precise and accurate power detector and threshold detector or the like should be used. The additional gain stage can overcome the offset of the detectors that follow and thus increase the resolution of the signal processing communication building block.

Figure 5:
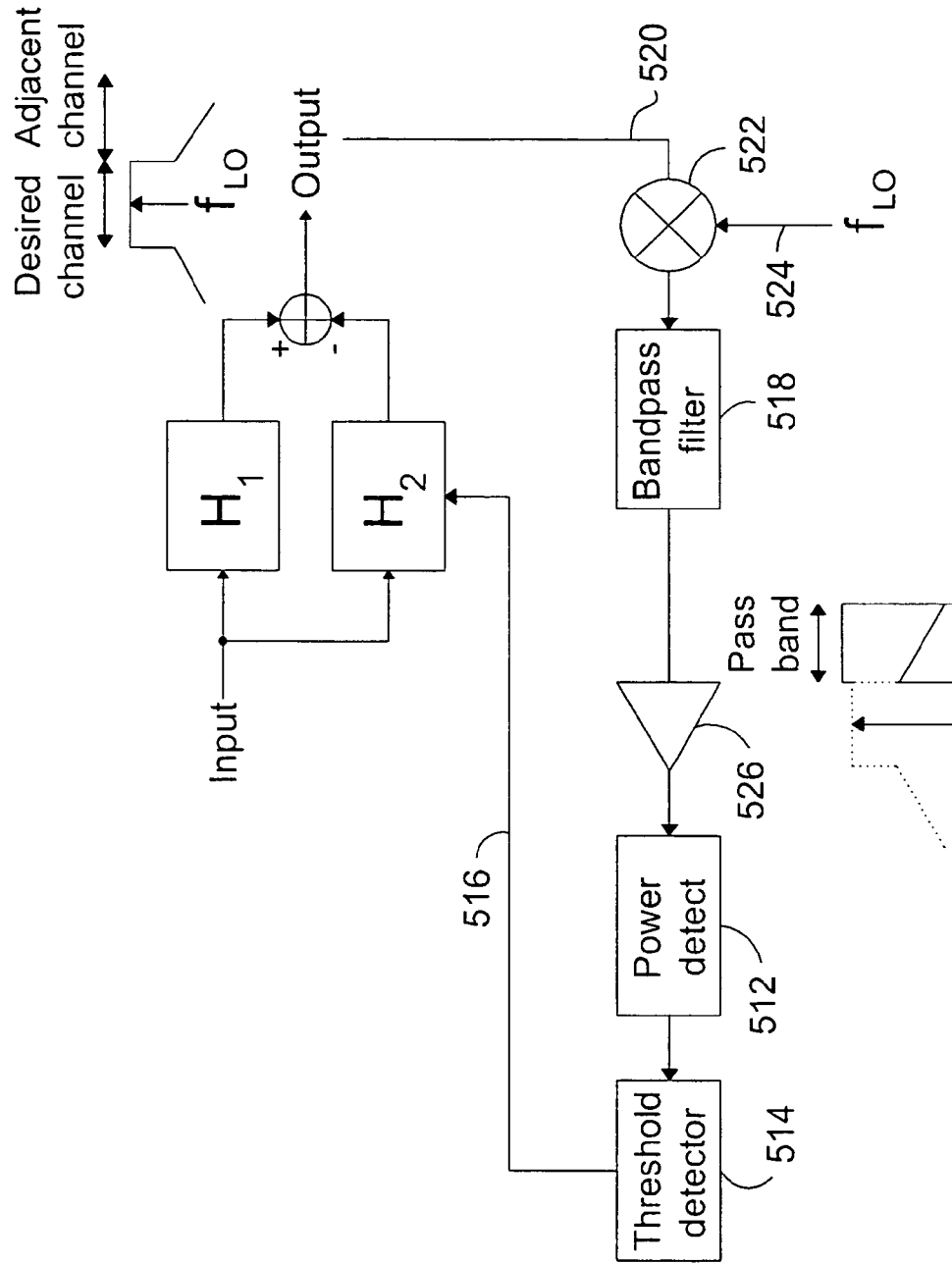
FIG. 5 is a block diagram that illustrates a preferred embodiment of a linearization apparatus incorporating a mixer according to the present invention.

FIG. 5 is a diagram that shows a second preferred embodiment of a linearization apparatus according to the present invention. As shown in FIG. 5, the second preferred embodiment of a linearization apparatus is particularly applicable to a power amplifier.

Figure 9:
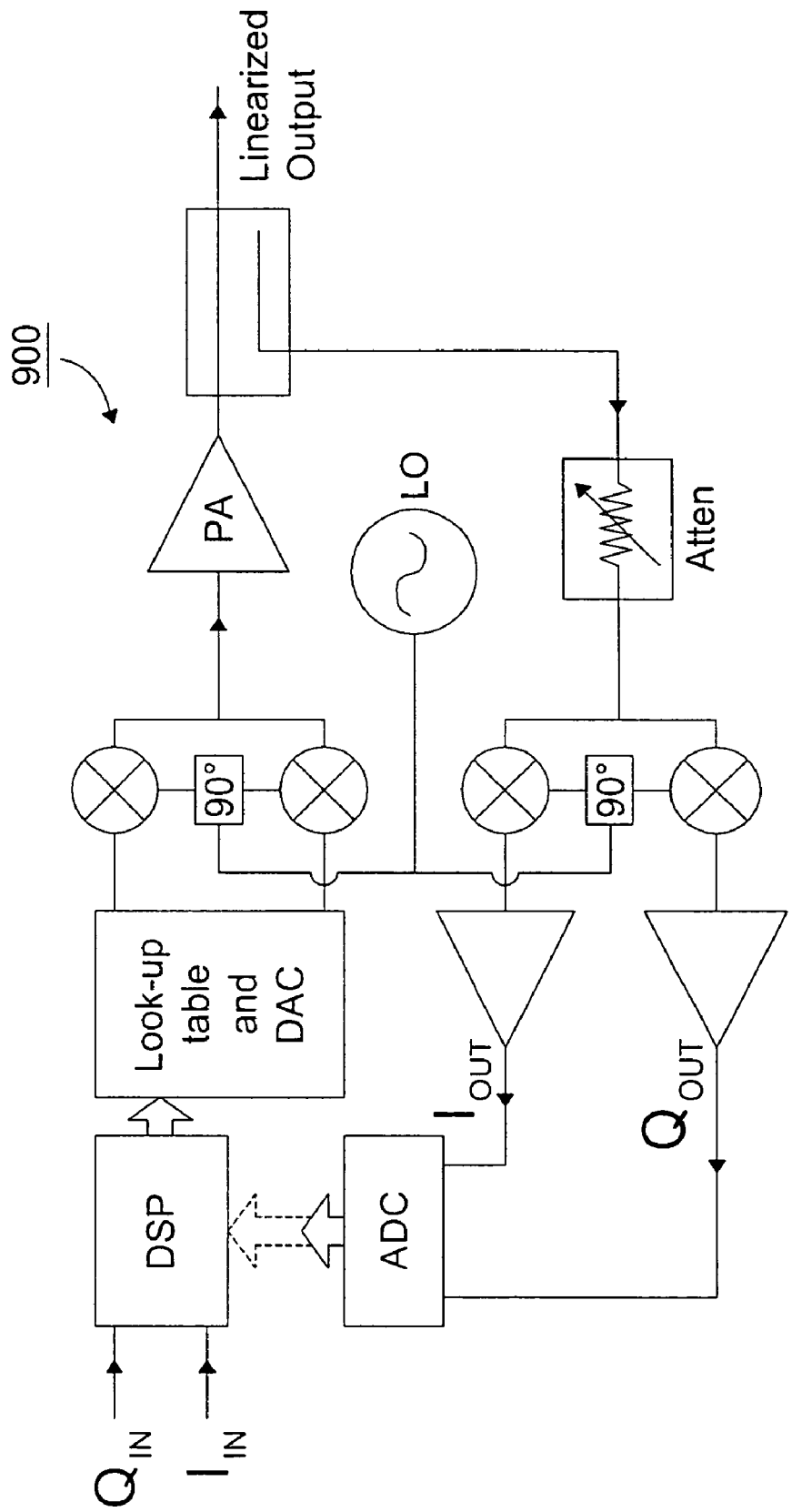
FIG. 9 is a diagram that shows a digital adaptive predistortion system for amplifier linearization.

FIG. 9 shows this example, where the proposed linearization technique is applied to a feed-forward linearizer.

As shown in FIG. 5, the auxiliary compensation building block $H_2$ is coupled to a correction loop. Thus, the correction loop can include a mixer 522 that receives an RF frequency output signal 520 of the block 300 and reduces the RF output signal in frequency using a local oscillator signal 524 preferably having a frequency $f_{LO}$. Thus, an output signal of the mixer 522 is reduced in frequency to a baseband or intermediate frequency by the frequency $f_{LO}$ using the mixer 522. The output of the mixer 522 is passed to bandpass filter 518 that preferably passes a channel adjacent or nearby a desired channel of the block 300. An amplifier 526 receives the output signal of the bandpass filter 518. A power detector 512 receives an amplified output signal from the amplifier 526. A threshold detector 514 receives an amplified output signal from the power detector 512 for comparison with a predetermined level. The threshold detector 514 outputs control parameters 516 of the auxiliary compensation building block $H_2$. Thus, if the threshold detector 514 determines the spectral leakage component is to large, the control parameters 516 of the auxiliary compensation building block $H_2$ are modified to generate a desired change in the non-linearity such as to reduce the non-linearity of the auxiliary block $H_2$ and decrease spectral leakage in the adjacent channel until it is determined to be below the predetermined amount by the threshold detector 514.

Figure 6:
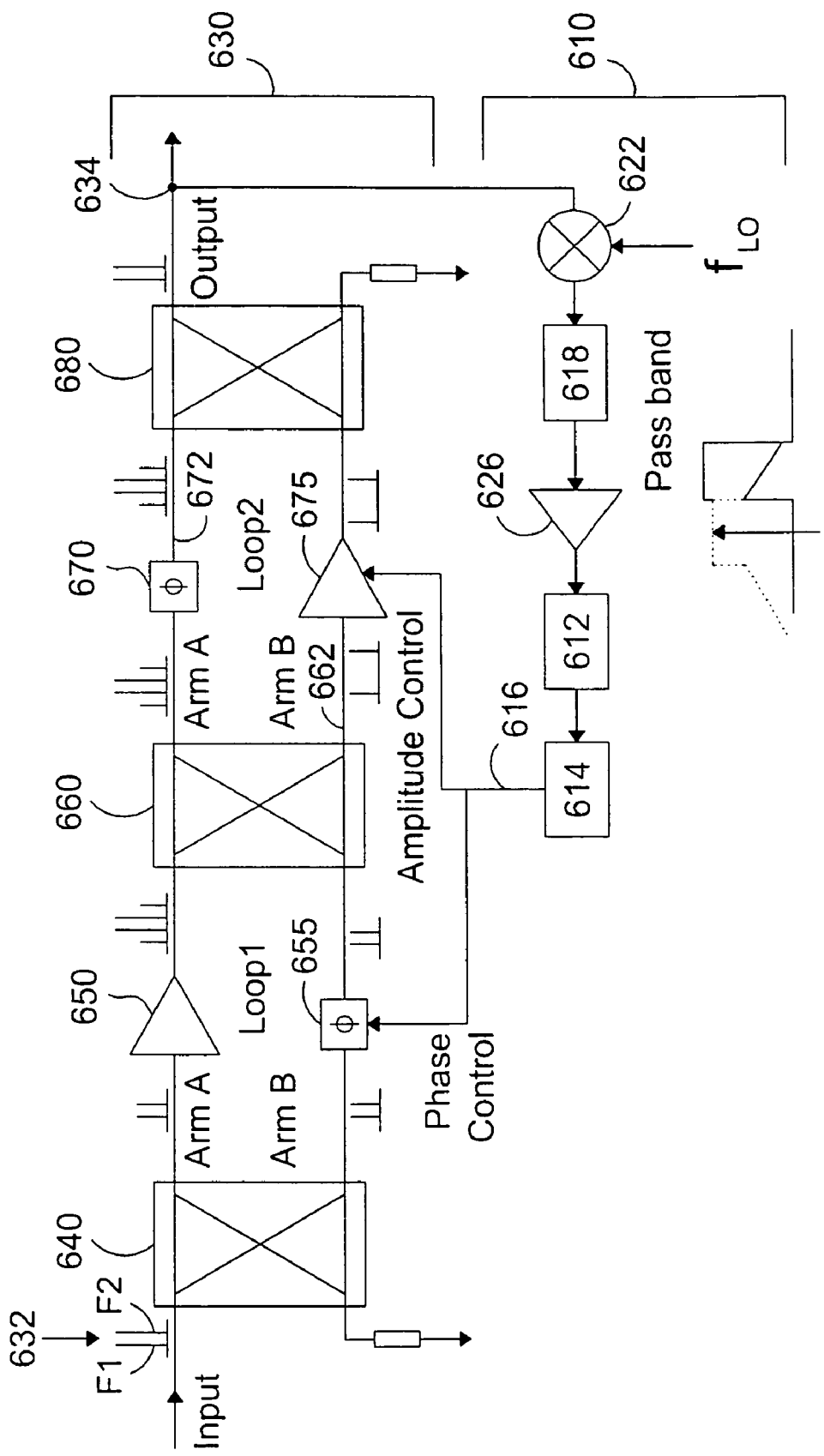
FIG. 6 is a diagram that illustrates a preferred embodiment of a linearization apparatus with a feed-forward linearization system according to the present invention.

FIG. 6 is a diagram that shows a third preferred embodiment of a linearization apparatus according to the present invention. As shown in FIG. 6, the third preferred embodiment of a linearization apparatus includes a feed-forward linearizer 630 and a linearization loop 610. The feed-forward linearizer 630 receives an input signal 632 that can include two different carrier signals each having different frequencies F1 and F2. The input signal 632 is provided through first coupler 640 through arm A to main amplifier 650 and through arm B to phase shifter 655. An output signal of the main amplifier 650 is provided through a second coupler 660 to phase shifter 670 that has an output signal provided to a third coupler 680. An output signal of the phase shifter 655 is received by the second coupler 660. The first coupler 640, the main amplifier 650, the phase shifter 655 and the second coupler 660 make up a cancellation loop 1. As such, an output of the cancellation loop 1 from the second coupler 660 via arm B has the input signal 632 removed and contains only distortion and noise produced as a result of device non-linearities such as imperfect amplification and intermodulation products of the main amplifier 650. However, the input signal 632 is not completely canceled in the cancellation loop 1 because of errors including non-ideal frequency response and matching of at least the main amplifier 650.

An output of the second coupler 660 is input to the phase shifter 670 via arm A and the output of the phase shifter 670 is input to the third coupler 680. The output of the second coupler 660 through arm B is input to auxiliary amplifier 675 that amplifies the adjusted distortion and noise component introduced to the input signal 632 by main amplifier 630. An output signal of the auxiliary amplifier 675 is input to the third coupler 680. The second coupler 660, the phase shifter 670, the auxiliary amplifier 675 and the third coupler 680 make up distortion cancellation loop 2 that can operate to reduce or remove the distortion and noise component from the output signal of main amplifier 650 to produce a preferably amplified output signal 634 having reduced noise and distortion introduced by the main amplifier 650.

Operations the feed-forward linearizer 630 isolate the distortion and noise generated by the main amplifier 650 in the cancellation loop 1, for example, by subtracting the input signal 632 from the amplified output of the main amplifier 650. A signal 662 is output from the second coupler 660 through arm B and amplified by the auxiliary amplifier 675, and then, for example, subtracted at the third coupler 680 from a phase shifted amplified output signal 672 of the main amplifier 650, which contains distortion and noise introduced by the main amplifier 650. Thus, the amplified output signal 634 from the feed-forward linearizer 630 has reduced distortion and noise.

As shown in FIG. 6, the gain of the auxiliary amplifier and the actual phase shift of the phase shifter in a secondary path (e.g., arm B) is controlled using the linearization loop 610. The linearization loop 610 provides linearization versatility, in that it can control any one or more parameters affecting the linearity of the feed-forward linearizer 630. As shown in FIG. 6, the correction loop 610 includes a mixer 622 that receives an RF frequency output signal 634 of the feed-forward linearizer 630 and reduces the RF output signal in frequency using a local oscillator signal preferably having a frequency $f_{LO}$. Thus, an output signal of the mixer 622 is reduced in frequency to a baseband or intermediate frequency by the frequency $f_{LO}$ using the mixer 622. The output signal of the mixer 622 is passed through bandpass filter 618 to a power detector 612 that detects an amount of the spectral component in a channel adjacent or nearby a desired channel of the feed-forward linearizer 630 via an amplifier 626. An output signal of the power detector 612 is received by a threshold detector 614 that outputs control parameters 616 of the feed-forward linearizer 630. As shown in FIG. 6, control parameters of the feed forward linearizer 630 include phase control and amplitude control. Thus, if the linearization loop 610 determines the spectral leakage component is out of a prescribed range, the control parameters 616 of the feed forward linearizer 630 are modified to generate a desired change in the non-linearity compensation preferably using at least one of the phase shifter 655 and the auxiliary amplifier 675.

Figure 7:
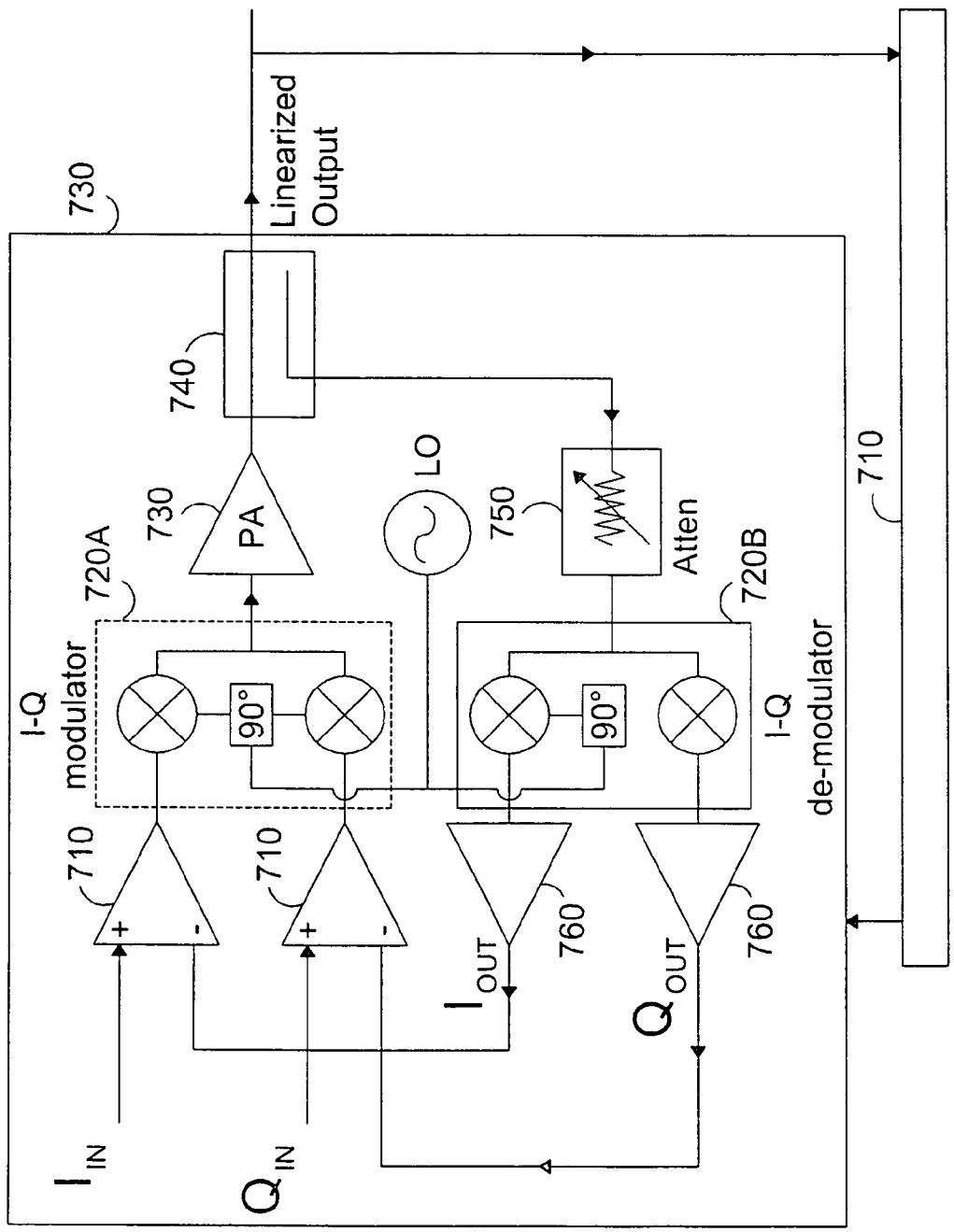
FIG. 7 is a diagram that illustrates a preferred embodiment of a linearization apparatus with a Cartesian feedback loop system according to the present invention.

FIG. 7 is a diagram that shows a fourth preferred embodiment of a linearization apparatus according to the present invention. As shown in FIG. 7, the fourth preferred embodiment of a linearization apparatus includes a Cartesian feedback loop for amplifier linearization 730 and a linearization loop 710. The Cartesian feedback loop for amplifier linearization 730 can receive respective I and Q inputs at a baseband frequency in differential amplifiers 710. Output signals of the amplifiers 710 are up converted by I-Q modulator 720A to preferably an RF frequency. The modulated signals are amplified by amplifier 730 (e.g. power amplifier PA) and a linearized output signal is transmitted via coupler 740 for transmission or the like. The coupler 740 further provides a portion of the linearized output signal to a feedback path. The feedback path can include a controllable attenuator 750, I-Q de-modulator 720B and amplifiers 760. An output signal of the attenuator 750 is down converted via I-Q de-modulator 720B to a baseband or intermediate frequency and after amplification by the amplifiers 760, respectively input to the differential amplifiers 710. The differential amplifiers 710 subtract the feedback path signals from the I and Q input signals to generate error signals to reduce non-linearity in operations of the Cartesian feed-back loop.

As shown in FIG. 7, at least the attenuator in the feedback path can be controlled using the linearization loop 710. The linearization loop 710 exhibits linearization versatility, in that it can control any one or more parameters affecting the linearity of the Cartesian feedback loop for amplifier linearization 730. As shown in FIG. 7, the correction loop 710 is preferably similar in structure to the correction loop 610. Thus, if the linearization loop 710 determines the spectral leakage component is too large, the control parameters 716 of the cartesian feedback loop for amplifier linearization 730 are modified to generate a desired change in the non-linearity compensation using at least the attenuator 760, although additional noise control devices such as attenuator units and amplifiers can additional be coupled in the feed-forward or the feedback paths and controlled using the control parameters 716.

Figure 8:
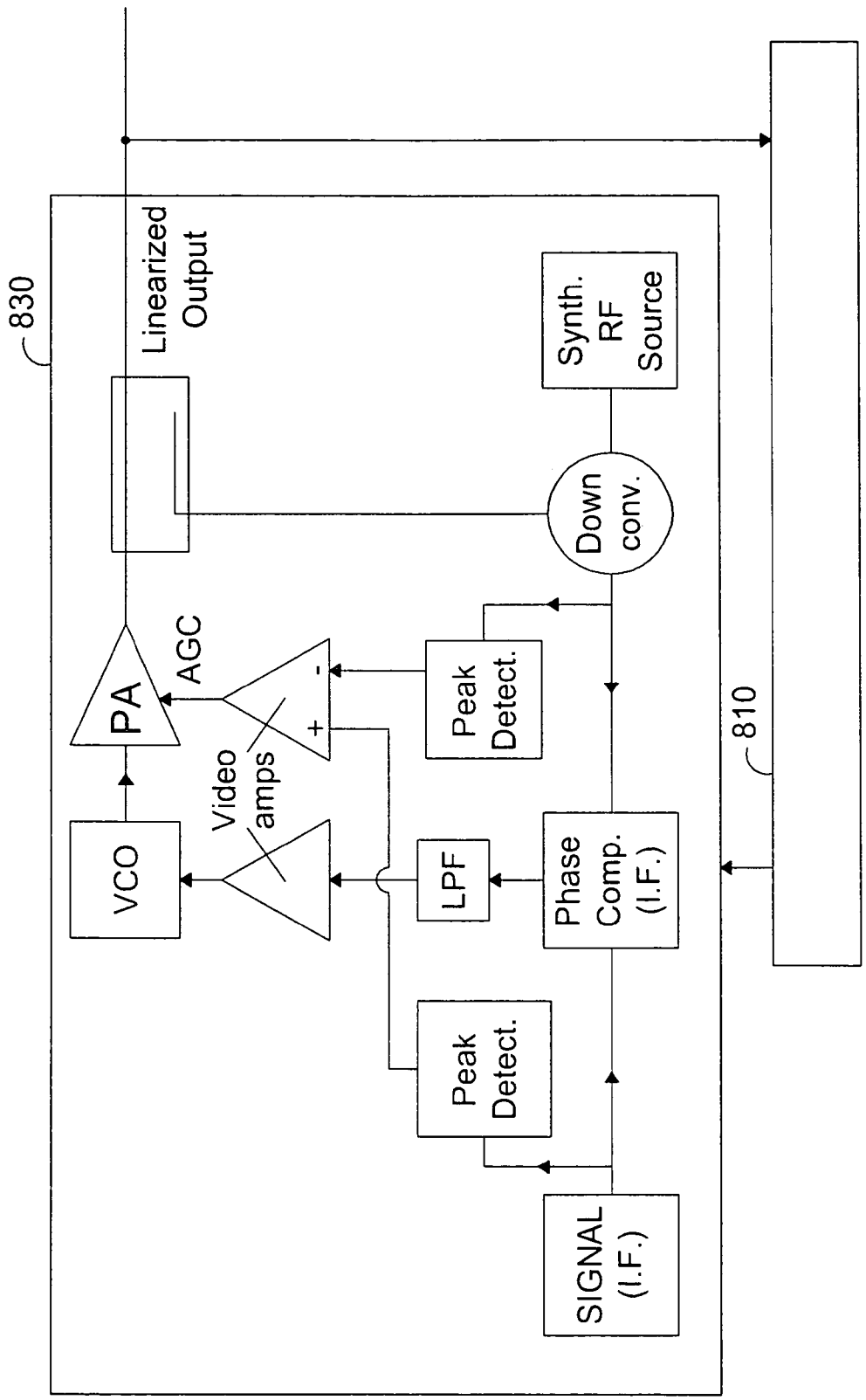
FIG. 8 is a diagram that illustrates a preferred embodiment of a linearization apparatus with a polar loop correction system according to the present invention.

FIG. 8 is a diagram that shows a fifth preferred embodiment of a linearization apparatus according to the present invention. As shown in FIG. 7, the fifth preferred embodiment of a linearization apparatus includes a polar loop correction system 830 and a linearization loop 810. The polar loop correction system 830 can receive an intermediate frequency signal that is split up into its polar components, amplitude and phase, and compared with corresponding components in a power amplifier PA output signal. A resulting phase error is input to a VCO that feeds the power amplifier a controlled (e.g., phase) input signal. An amplitude error signal modulates a control input of the power amplifier. A phase lock loop can track the phase and a feedback circuit track the amplitude. A channel frequency can be set by a RF source such a s an oscillator in the feedback path.

As shown in FIG. 8, at least the amplitude and phase polar components can be controlled using the linearization loop 810. The linearization loop 810 preferably provides linearization versatility, in that it can control any one or more parameters affecting the linearity of the polar loop correction system 830. As shown in FIG. 8, the correction loop 810 is preferably similar in structure to the correction loop 610. Thus, the control parameters 816 of the polar loop correction system 830 are modified to generate a desired change in the polar components, although additional non-linearity control elements can added.

FIG. 9 is a diagram that shows an exemplary digital adaptive pre-distortion system 900. Operations of the digital adaptive pre-distortion system 900 are similar to a Cartesian loop, but differs in that digital signal processing (DSP) and look-up tables (LUT) are used for non-linearity cancellation. Although the correction of the system 900 is adaptive and thus fairly reliable, it requires large area and power. Thus, the system is not in low power amplifier (PA) applications.

Figure 10:
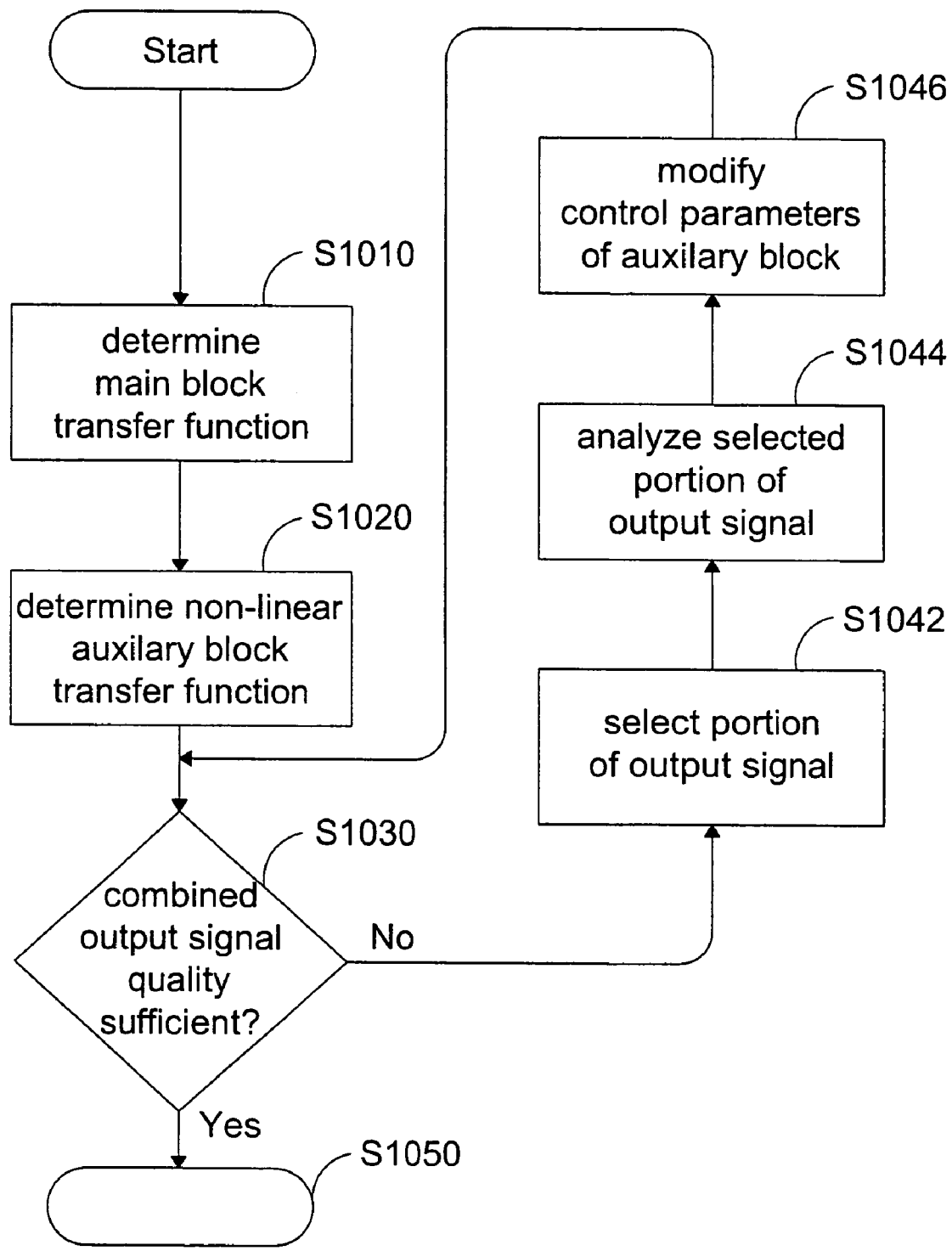
FIG. 10 is a flow chart that illustrates a preferred embodiment of a method for linearization of a signal processing block according to the present invention.

FIG. 10 is a diagram that illustrates a method of linearizing an output signal of a signal processing system according to the present invention. As shown in FIG. 10, after a process starts control continues to step S1010 where the transfer function of a main signal processing block is determined in step S1010. The main signal processing block can be one or more or a combination of functional building blocks including mixers, amplifiers, filters and the like. From step S1010, control continues to step S1020 where a transfer function of a non-linear auxiliary block is determined. The transfer functions of the main signal processing block and the non-linear auxiliary block are determined to satisfy equations 2–4 as described above. From step S1020, control continues to step S1030. In step S1030, it is determined whether the combined output signal of the signal processing system is within desired parameters because of the cumulation of device non-linearities by the system result in a desired signal processing of an input function by the main signal block. The determination is step S1030 can be a one time, or multiple times or periodic determination. If the determination in step S1030 is affirmative, control continues to step S1050 where the process ends.

If the determination in step S1030 is negative, control continues to step S1042 where a portion of the output signal is retrieved for analysis. For example, in step S1042, a filter or the like could pass a selected channel of the output signal while reducing or blocking remaining portions of the output signal. From step S1042, control continues to step S1044 where a selected portion of the output signal is analyzed. For example, in step S1044 a power level in a selected channel is analyzed to determine its level. For example, the signal analysis is based on an averaging of the output signal. From step S1044, control continues to step S1046.

In step S1046, if the signal level of the selected portion of the output signal is greater than a prescribed amount such as a threshold level, control parameters of the non-linear auxiliary block are modified. The modification of the control parameters of the non-linear auxiliary block can reduce or increase the non-linearity and thereby modify cancellation of noise generated from device non-linearities in the system. From step S1046, control jumps back to step S1030.

In general, various methods can increase linearity. Most efforts have been devoted to the design of power amplifiers, because most power in wireless systems is consumed by the power amplifier. Amplifier linearization approaches can involve one of the following techniques: Cartesian loop; polar loop; feed-forward; and pre-distortion. Cartesian feedback loops can have a symmetrical structure when compared to the polar loop, and thus are less likely to introduce phase shifts between the AM-AM and AM-PM processes that effect all correction systems. Video bandwidth and stability, however, limit the capability to handle multi-carrier signals.

Unlike the Cartesian and polar loop feedback topologies, a feed-forward linearization system can exhibit very low instability and bandwidth limitations. However, feed-forward linearization systems require precise matching in gain and phase to obtain sufficient rejection of harmonic signals.

Preferred embodiments according to the present invention can be applied to any communication system requiring a high level of linearity. Preferred embodiments can be used in wireless applications, whereby the proposed technique can be used to linearize a power amplifier with minimal overhead.

Preferred embodiments of the present invention are desirable for linearization in communication systems. An advantage of the present invention, for example as shown in FIG. 3, is that an auxiliary non-linear block is used to increase linearity. The overhead due to the presence of an auxiliary block is quite small, because the auxiliary non-linear block can be designed to be very small and have low power consumption. Moreover, there is no feedback path, and thus it does not cause any stability issues or performance degradation due to feedback delay. Preferred embodiments described in FIGS. 3–5 achieve the above advantage, since additional hardware is not so critical to performance.

Although selected preferred embodiments according to the present invention use a feedback path, it does not cause any stability issues because the cancellation apparatus and processes are based on an averaging and only deals with power leakage in the side-band due to the non-linearities. Hence, delay effects found in Cartesian loops and the like do not exist in the present invention.

Moreover, when compared with pre-distortion techniques, preferred embodiments according to the present invention require less hardware and is easier to implement. In contrast, since the preferred embodiments only deal with power caused by nonlinearities, the proposed linearization approach does not require any sophisticated algorithms and bulky digital hardware. Thus, the proposed approach can even be used with low power, power amplifier (PA) applications.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A circuit for linearizing an input signal x(t), comprising:
   a main circuit that receives the input signal with a main transfer function of approximately H1 and outputs a main signal output;
   a nonlinear auxiliary circuit that receives the input signal and has a nonlinear auxiliary transfer function of approximately H2 and outputs a nonlinear auxiliary signal output, wherein $H_1(X)=a_1X+a_3X^3$ and $H_2(X)=b_1X+b_3X^3$ and X is the transform of x(t), $a_1xa_3<0$, $b_1xb_3<0$, $a_1-a_3$ is approximately $a_1$, and $b_1-b_3$ is approximately 0; and
   a combiner coupled to said main circuit and said nonlinear auxiliary circuit that combines said main signal and said auxiliary signal to yield an output signal.

2. The circuit of claim 1, further comprising a feedback loop coupled to said combiner.

3. The circuit of claim 2, wherein said feedback loop comprises a bandpass filter.

4. The circuit of claim 3, wherein said feedback loop further comprises a gain stage.

5. The circuit of claim 2, wherein said feedback loop further comprises a power detector.

6. The circuit of claim 2, wherein said feedback loop further comprises a threshold detector.

7. The circuit of claim 2, wherein said feedback loop further comprises:

a bandpass filter coupled to the combiner that receives the output signal;
a gain stage coupled to receive an output of the bandpass filter;
a power detector coupled to receive an output of the gain stage; and
a threshold detector coupled to receive an output signal of the power detector, wherein an output of the threshold detector is received by the nonlinear auxiliary circuit.

8. The circuit of claim 7, further comprising a mixer coupled to an input of the bandpass filter.

9. The circuit of claim 1, further comprising a feedback loop, wherein said feedback loop receives a portion of the output signal and outputs a non-linearity control signal to said auxiliary nonlinear circuit.

10. The circuit of claim 9, further comprising a non-linearity detector that detects the amount of non-linearity in the output signal, wherein the non-linearity control signal is based on the amount of non-linearity detected by said non-linearity detector.

11. The circuit of claim 10, wherein said nonlinear auxiliary circuit increases a power level of said nonlinear auxiliary output signal in proportion to the non-linearity control signal.

12. The circuit of claim 9, further comprising a non-linearity detector that detects the amount of non-linearity in the output signal, wherein the non-linearity feedback signal is proportional to the amount of non-linearity detected by the nonlinear detector.

13. The circuit of claim 12, wherein said feedback loop further comprises:
   a bandpass filter coupled to the combiner that receives the output signal;
   a gain stage coupled to receive an output signal of the bandpass filter;
   a power detector coupled to receive an output signal of the gain stage; and
   a threshold detector coupled to receive an output signal of the power detector, wherein an output of the threshold detector is received by the nonlinear auxiliary circuit.

14. The circuit of claim 9, wherein said main circuit comprises a linearization circuit.

15. The circuit of claim 1, wherein said main circuit comprises a linearization circuit.

16. The circuit of claim 15, further comprising a feedback loop, wherein said feedback receives a portion of the output signal and outputs a non-linearity feedback signal to said nonlinear auxiliary circuit.

17. The circuit of claim 16, wherein said feedback loop further comprises a nonlinearity detector that detects the amount of non-linearity in the output signal, wherein the nonlinearity feedback signal is proportional to the amount of non-linearity detected by the non-linearity detector.

18. The circuit of claim 17, wherein said nonlinear auxiliary circuit increases a power level of said nonlinear auxiliary output signal in proportion to the non-linearity feedback signal.

19. The circuit of claim 18, wherein said feedback loop further comprises:
   a bandpass filter coupled to the combiner that receives the output signal;
   a gain stage coupled to receive an output signal of the bandpass filter;
   a power detector coupled to receive an output signal of the gain stage; and a threshold detector coupled to receive an output signal of the power detector, wherein an output signal of the threshold detector is received by the nonlinear auxiliary circuit.

20. The circuit of claim 15, wherein said linearization circuit comprises one of a feed-forward linearizer, a Cartesian feedback loop, a polar loop correction system and a digital adaptive pre-distortion system.

21. The circuit of claim 20, further comprising a feedback loop, wherein said feedback loop receives a portion of the output signal and outputs a non-linearity feedback signal to said nonlinear auxiliary circuit.

22. The circuit of claim 21, wherein said feedback loop further comprises a non-linearity detector that detects the amount of non-linearity in the output signal, wherein the non-linearity feedback signal is proportional to the amount of non-linearity detected by the non-linearity detector.

23. The circuit of claim 22, wherein said auxiliary nonlinear circuit increases a power level of said nonlinear auxiliary signal output in proportion to the non-linearity feedback signal.

24. A circuit for linearizing an input signal, comprising:
a main circuit that receives the input signal and outputs a main output signal;
a nonlinear auxiliary output signal;
a combiner coupled to said main circuit and said nonlinear circuit that combines the main signal and the auxiliary signal to yield an output signal; and
a feedback loop that receives a portion of the output signal and outputs a non-linearity feedback signal to said auxiliary nonlinear circuit,
wherein the feedback loop includes a bandpass filter to pass adjacent or nearby channels of the output signal output from the combiner to determine if spectral leakage occurs in the adjacent or nearby channels.

25. A method for linearizing an input signal, comprising:
processing the input signal with a main signal processing circuit;
processing the input signal with a non-linear circuit;
combining an output signal of the main signal processing circuit and the non-linear circuit to generate an output signal;
passing adjacent or nearby channels of the combined output signal through a bandpass filter;
determining if spectral leakage occurs in the adjacent or nearby channels; and
determining an adjustment to control parameters of the non-linear auxiliary circuit to change one of increase or decrease its non-linearity based on determining if spectral leakage occurs in the adjacent or nearby channels.

26. A method for improving signal quality in a signal processing system, comprising:
(a) processing an input signal based on a transfer function H1;
(b) processing the input signal based on a transfer function H2; and
(c) subtracting the processed signals from steps (a) and (b),
wherein step (b) includes increasing non-linearity of transfer function H2 by an amount sufficient to substantially suppress at least one predetermined harmonic in the processed signal output from step (a) and at least first- and third-order harmonics in the processed signal output from step (b) when the processed signals are subtracted in step (c), and
wherein $H_1(X) = a_1 X + a_3 X^3$ and $H_2(X) = b_1 X + b_3 X^3$ and X is the transform of x(t), $a_1 x a_3 < 0$, $b_1 x b_3 < 0$, $a_1 - a_3$ is approximately $a_1$, and $b_1 - b_3$ is approximately 0.

27. The method of claim 26, wherein the step of increasing the non-linearity of transfer function H2 includes: adjusting a loop control parameter which increases the non-linearity of transfer function H2.

28. The method of claim 26, wherein said at least one predetermined harmonic is a third-order harmonic.

29. A system for improving signal quality in a signal processing system, comprising:
a first signal processing block which modifies an input signal based on a transfer function H1;
a second signal processing block which modifies the input signal based on a transfer function H2;
a combiner that combines the processed signals from the first and second signal processing blocks, wherein the second signal processing block increases non-linearity of transfer function H2 by an amount sufficient to substantially suppress at least one predetermined harmonic in the processed signal output from the first signal processing block and at least first- and third-order harmonics in the processed signal output from the second signal processing block when the processed signals are combined by the combiners
wherein $H_1(X) = a_1 X + a_3 X^3$ and $H_2(X) = b_1 X + b_3 X^3$ and X is the transform of x(t), $a_1 x a_3 < 0$, $b_1 x b_3 < 0$, $a_1 - a_3$ is approximately $a_1$, and $b_1 - b_3$ is approximately 0.

30. The system of claim 29, wherein the second signal processing block adjusts a loop control parameter which increases the non-linearity of transfer function H2.

31. The system of claim 29, wherein said at least one predetermined harmonic is a third-order harmonic.

32. The system of claim 29, wherein the combiner is a subtractor.

33. The system of claim 29, wherein the second signal processing block increases the non-linearity of transfer function H2 by an amount sufficient to substantially suppress all harmonics in the processed signal output from the first signal processing block except a first-order harmonic, and to suppress at all harmonics in the processed signal output from the second signal processing block when the processed signals are subtracted in a subtractor.

34. A circuit for an initially at least partially nonlinear circuit; comprising:
means for splitting an input signal into a first and second input signal;
means for determining the effect of the at least partially nonlinear circuit on a predetermined harmonic of said first input signal; and
a unit that receives said second input signal and modifies a second predetermined harmonic of said second input signal in a manner such that if the output of said unit and said at least partially nonlinear circuit are combined, the predetermined harmonic of said first input signal is at least partially suppressed,
wherein the determining means includes a bandpass filter to a pass adjacent or nearby channels of the combined output signal to determine if spectral leakage occurs in the adjacent or nearby channels.

35. The circuit of claim 24, wherein said feedback loop further comprises:
a gain stage coupled to receive an output of the bandpass filter;
a power detector coupled to receive an output of the gain stage; and a threshold detector coupled to receive an output of the power detector, wherein an output of the threshold detector is received by the nonlinear auxiliary circuit.

36. The circuit of claim 34, wherein the determining means further comprises:
   a gain stage coupled to receive an output of the bandpass filter;
   a power detector coupled to receive an output of the gain stage; and
   a threshold detector coupled to receive an output of the power detector, wherein an output of the threshold detector is received by the nonlinear auxiliary circuit.

37. A circuit for linearizing an input signal x(t), comprising:
   a main circuit that receives the input signal with a main transfer function of approximately H1 and outputs a main signal output;
   a nonlinear auxiliary circuit that receives the input signal and has a nonlinear auxiliary transfer function of approximately H2 and outputs a nonlinear auxiliary signal output, wherein $H_1(X)=a_1X+a_3X^3$ and $H_2(X)=b_1X+b_3X^3$ and X is the transform of x(t), $a_1 x a_3 < 0$, $b_1 x b_3 < 0$, $a_1-a_3$ is approximately $a_1$, and $b_1-b_3$ is approximately 0;
   a combiner coupled to said main circuit and said nonlinear auxiliary circuit that combines said main signal and said auxiliary signal to yield an output signal; and
   a feedback loop that receives a portion of the output signal and outputs a non-linearity feedback signal to said auxiliary nonlinear circuit,
   wherein said main circuit comprises a linearization circuit.

* * * * *